US010423066B2

(12) United States Patent
Izawa et al.

(10) Patent No.: US 10,423,066 B2
(45) Date of Patent: Sep. 24, 2019

(54) TEMPLATE, IMPRINT DEVICE, AND MANUFACTURING METHOD OF SEMICONDUCTOR DEVICE

(71) Applicant: Toshiba Memory Corporation, Minato-ku (JP)

(72) Inventors: Yusaku Izawa, Yokkaichi (JP); Masaki Mae, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/698,413

(22) Filed: Sep. 7, 2017

(65) Prior Publication Data

US 2018/0224740 A1   Aug. 9, 2018

(30) Foreign Application Priority Data

Feb. 3, 2017   (JP) .................. 2017-018224

(51) Int. Cl.
| | |
|---|---|
| *G03F 7/00* | (2006.01) |
| *H01L 21/768* | (2006.01) |
| *H01L 21/311* | (2006.01) |
| *H01L 21/02* | (2006.01) |
| *H01L 27/11548* | (2017.01) |
| *H01L 27/11575* | (2017.01) |

(52) U.S. Cl.
CPC ...... *G03F 7/0002* (2013.01); *H01L 21/02304* (2013.01); *H01L 21/31144* (2013.01); *H01L 21/76802* (2013.01); *H01L 21/76877* (2013.01); *H01L 27/11548* (2013.01); *H01L 27/11575* (2013.01)

(58) Field of Classification Search
None
See application file for complete search history.

(56) References Cited

U.S. PATENT DOCUMENTS

| | | | |
|---|---|---|---|
| 9,099,349 B2 | 8/2015 | Kofuji et al. | |
| 9,147,687 B2 | 9/2015 | Koh et al. | |
| 2012/0315349 A1* | 12/2012 | Zhang | B29C 33/424 425/385 |
| 2016/0308020 A1* | 10/2016 | Sreenivasan | H01L 29/6659 |
| 2018/0170089 A1* | 6/2018 | Choi | G03F 7/0002 |

FOREIGN PATENT DOCUMENTS

| | | |
|---|---|---|
| JP | 2012-243777 | 12/2012 |
| JP | 2014-127475 | 7/2014 |
| JP | 2014-194960 | 10/2014 |

\* cited by examiner

*Primary Examiner* — Thien F Tran (74) *Attorney, Agent, or Firm* — Oblon, McClelland, Maier & Neustadt, L.L.P.

(57) ABSTRACT

According to an embodiment, a template includes steps in first to Nth (N is an integer of 2 or greater) stairs formed in a staircase pattern in a height direction. The steps include first steps in the first to Kth (K is an integer of 1 or greater and N−1 or less) stairs and second steps in (K+1)th to Mth (M is an integer of K+1 or greater and N or less) stairs. A height of the second steps is greater than a height of the first steps.

8 Claims, 9 Drawing Sheets

TEMPLATE, IMPRINT DEVICE, AND MANUFACTURING METHOD OF SEMICONDUCTOR DEVICE

CROSS-REFERENCE TO RELATED APPLICATIONS

This application is based upon and claims the benefit of priority front Japanese Patent Application No. 2017-018224, filed on Feb. 3, 2017; the entire content of which are incorporated herein by reference.

FIELD

Embodiments described herein relate generally to a template, an imprint device, and a manufacturing method of semiconductor device.

BACKGROUND

With finer semiconductor devices, imprint lithography may be used rather than photolithography due to lower costs. In imprint lithography, a staircase shape of a three-dimensional structure can be formed by one transfer of a template.

BRIEF DESCRIPTION OF THE DRAWINGS

FIGS. 6A1 to 6A3 are cross-sectional views of the etching state of the imprint pattern 5', and FIGS. 6B1 to 6B3 are cross-sectional views of the etching state of the imprint pattern 5;

DETAILED DESCRIPTION

In general, according to one embodiment, a template includes steps in first to Nth (N is an integer of 2 or greater) stairs formed in a staircase pattern in a height direction. The steps include first steps in the first to Kth (K is an integer of 1 or greater and N−1 or less) stairs and second steps in (K+1)th to Mth (M is an integer of K+1 or greater and N or less) stairs. A height of the second steps is greater than a height of the first steps.

Embodiments of a template, an imprint device, and a manufacturing method of a semiconductor device will be explained below in detail with reference to the accompanying drawings. The present invention is not limited to the following embodiments.

First Embodiment

FIGS. 1A to 1D, 2A to 2D, and 3A to 3C are cross-sectional views illustrating a manufacturing method of a semiconductor device according to a first embodiment. In the drawings, x, y, and z represent coordinate axes orthogonal to one another in a three-dimensional space.

Figure 1A:
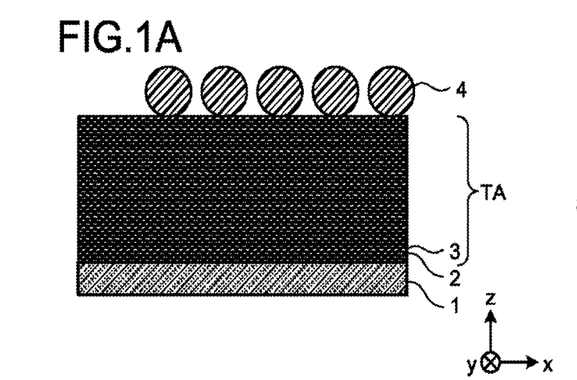
FIGS. 1A to 1D are cross-sectional views illustrating a manufacturing method of a semiconductor device according to a first embodiment.

Referring to FIG. 1A, a base material 1 has a stacked body TA thereon. The base material 1 may be an insulation layer, a semiconductor layer, or a conductive layer. The base material 1 may have an integrated circuit formed thereon. The stacked body TA has insulation layers 2 and 3 different in material stacked in sequence thereon. The material for the insulation layers 2 may be a silicon nitride film, for example. The material for the insulation layers 3 may be a silicon oxide film, for example. An imprint material 4 is dropped onto the stacked body TA. The material for the imprint material 4 may be an ultraviolet curable resin or a thermoset resin. To drop the imprint material 4, the imprint material 4 may be discharged onto the stacked body TA by an inkjet method.

Figure 1B:
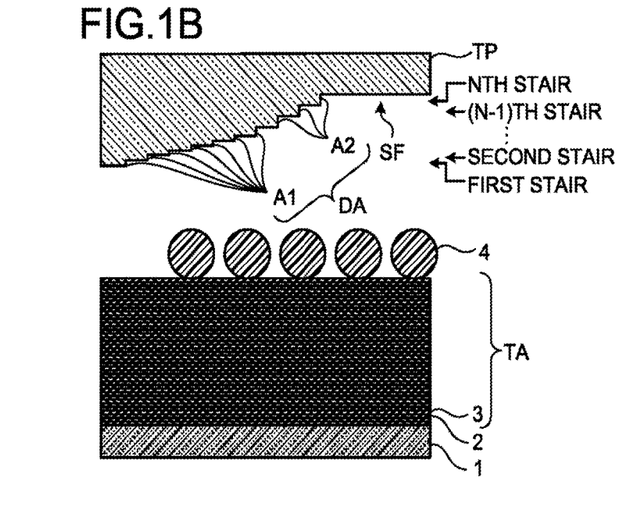

Next, as illustrated in FIG. 1B, a template TP is disposed in a shot region. The template TP has steps DA in a staircase pattern in first to Nth (N is an integer of 2 or greater) stairs formed in a height direction (z-axis direction) on a surface SF. The steps DA are provided in the z direction in the first to Nth stairs while being shifted in an x direction. FIG. 1B illustrates the case in which N=10. The steps DA include steps A1 and steps A2. The height of the steps A2 is greater than the height of the steps A1. The height ratio of the steps A2 to the steps A1 is preferably greater than 1 and 5 or less. The steps A1 can be provided in the first to Kth (K is an integer of 1 or greater and N−1 or less) stairs. The steps A2 can be provided in the (K+1)th to Mth (M is an integer of K+1 or greater and N or less) stairs. FIG. 1B illustrates the case in which K=6 and M=10.

When the material for the imprint material 4 is an ultraviolet curable resin, the material for the template TP can be an ultraviolet-transmissive material, for example, quartz. When the material for the imprint material 4 is a thermoset resin, the material for the template TP can be a metallic or ceramic material.

Figure 1C:
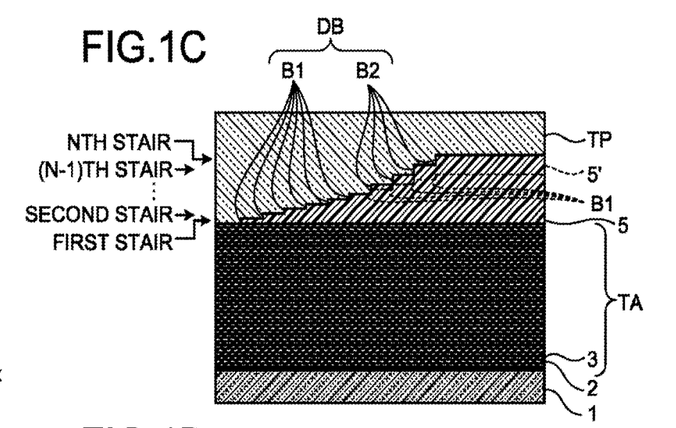

Next, as illustrated in FIG. 1C, the template TP is pressed against the imprint material 4 to form an imprint pattern 5 on the stacked body TA. The imprint pattern 5 has steps DB formed by transferring the steps DA in the template TP. The steps DB in the imprint pattern 5 include steps B1 corresponding to the steps A1 in the template TP and steps B2 corresponding to the steps A2 in the template TP. Then, the imprint pattern 5 is cured while the template TP is pressed against the imprint pattern 5. When the steps A2 in the template TP are the steps A1, an imprint pattern 5' is formed instead of the imprint pattern 5.

Figure 1D:
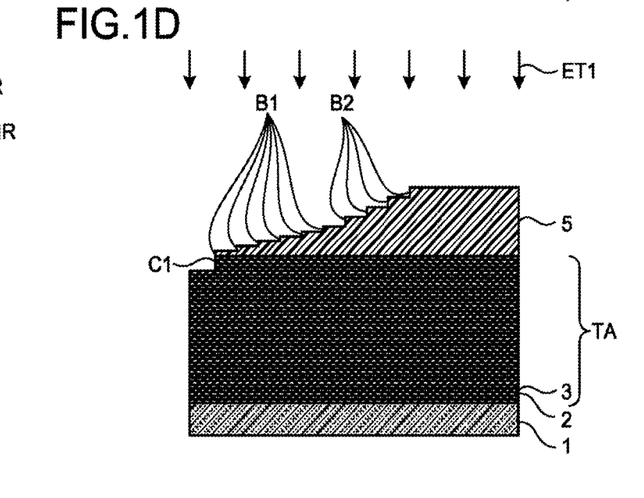

Next, as illustrated in FIG. 1D, after the curing of the imprint pattern 5, the template TP is separated from the imprint pattern 5. Then, the insulation layers 2 and 3 are subjected to etching ET1 with the imprint pattern 5 as a mask to form a step C1 in the stacked body TA. The etching ET1 on the insulation layers 2 and 3 can be performed using a CF-based gas.

Figure 2A:
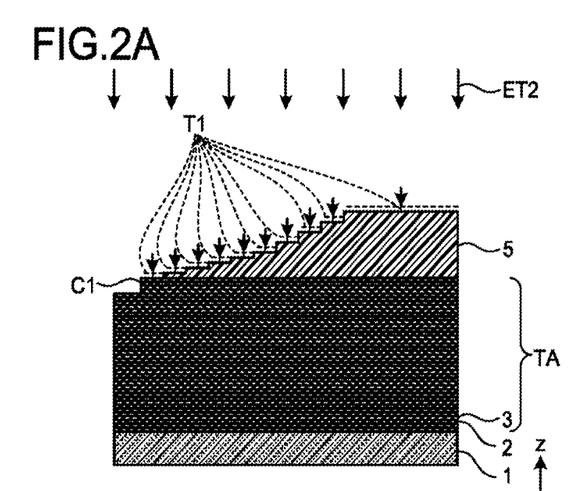
FIGS. 2A to 2D are cross-sectional views illustrating the manufacturing method of the semiconductor device according to the first embodiment.

Next, as illustrated in FIG. 2A, the imprint pattern 5 is subjected to etching ET2 to thin the imprint pattern 5 by a film thickness T1 to eliminate the step B1 in the bottom stair layer of the imprint pattern 5. The film thickness T1 is the residual film thickness of the step B1 of the first stair in the imprint pattern 5 at the time of formation of the step C1 of the first stair. The etching ET2 on the imprint pattern 5 can be performed using an $O_2$-based gas. In the etching ET2, the imprint pattern 5 can be selectively etched with respect to the insulation layers 2 and 3.

Figure 2B:
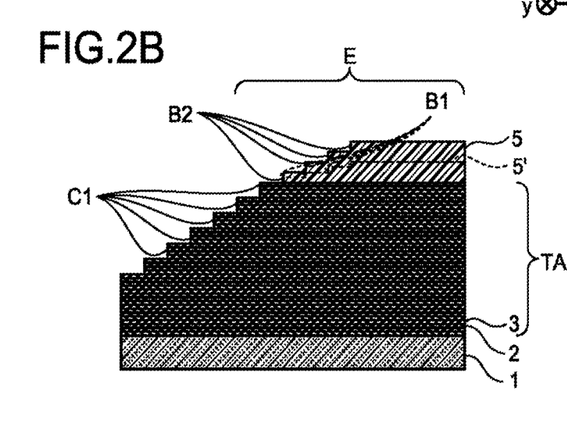

Next, as illustrated in FIG. 2B, the processes illustrated in FIGS. 1D and 2A are repeatedly performed on the individual stairs to form the steps C1 corresponding in numbers to the steps B1 in the imprint pattern 5 on the stacked body TA. At that time, in the imprint pattern 5, the steps B1 disappear and the steps B2 remain. Uneven etching would result in height variations between the individual steps B2 in a y direction.

Figure 4A:
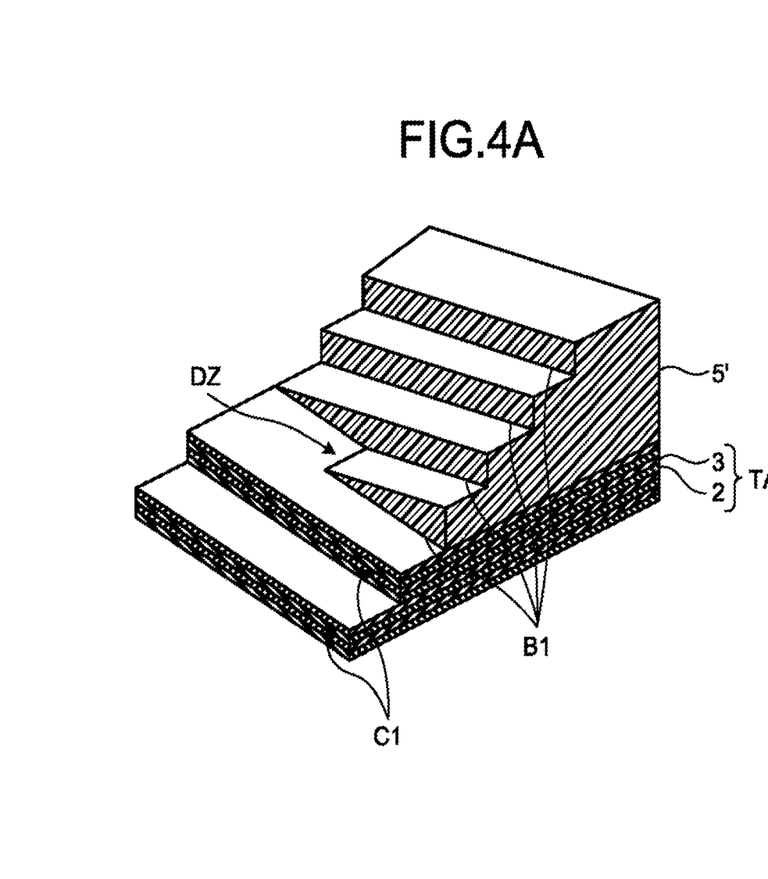
FIG. 4A is a perspective view of a three-dimensional shape of an imprint pattern 5' in an portion E illustrated in FIG. 2B.
Figure 4B:
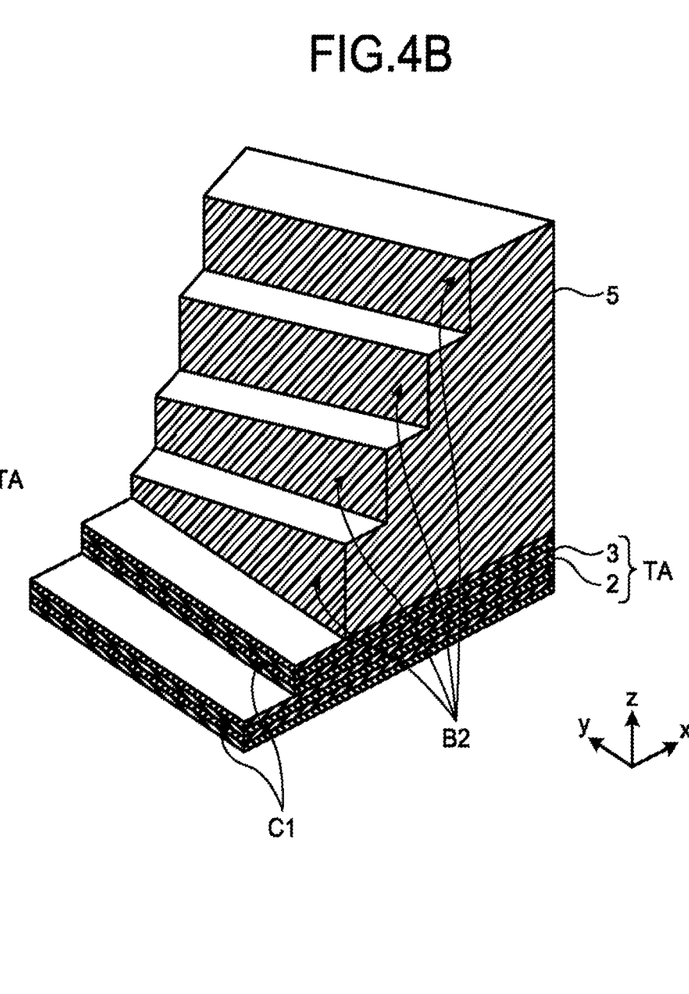
FIG. 4B is a perspective view of a three-dimensional shape of an imprint pattern 5 in the portion E illustrated in FIG. 2B.

FIG. 4A is a perspective view of a three-dimensional shape of the imprint pattern 5' in a portion E illustrated in FIG. 2B, and FIG. 4B is a perspective view of a three-dimensional shape of the imprint pattern 5 in the portion E illustrated in FIG. 2B.

In the imprint pattern 5', the steps B1 are inclined in the y direction due to the unevenness of the etching as illustrated in FIG. 4A.

In the imprint pattern 5, the steps B2 are inclined in the y direction due to the unevenness of the etching as illustrated in FIG. 4B.

In the imprint pattern 5', a part of the step B1 has been lost within a single stair to cause a step shift DZ.

Meanwhile, in the imprint pattern 5, none of the stairs have lost step B2 and no step shift DZ is caused.

Figure 2C:
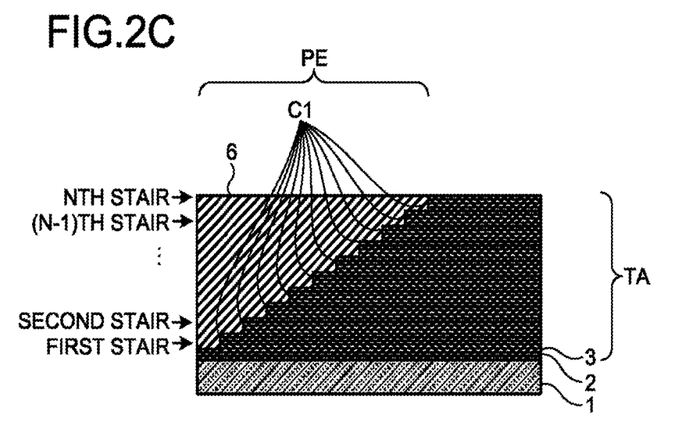

Then, as illustrated in FIG. 2C, repeating the processes illustrated in FIGS. 1D and 2A on the individual stairs to form an etching pattern PE corresponding to the imprint pattern 5 on the stacked body TA. The etching pattern PE has the steps C1 corresponding in numbers to the steps B1 and B2. The steps C1 in the etching pattern PE can be equal in height between the steps corresponding to the steps B1 in the imprint pattern 5 and the steps corresponding to the steps B2 in the imprint pattern 5.

In the imprint pattern 5, it is possible to eliminate the loss of the step B2 within a single stair when the steps B1 disappear, as illustrated in FIG. 4B. Accordingly, even when the stacked body TA is etched with the imprint pattern 5 as a mask, it is possible to prevent occurrence of a step shift DZ in the step C1 in the etching pattern PE.

Figure 5:
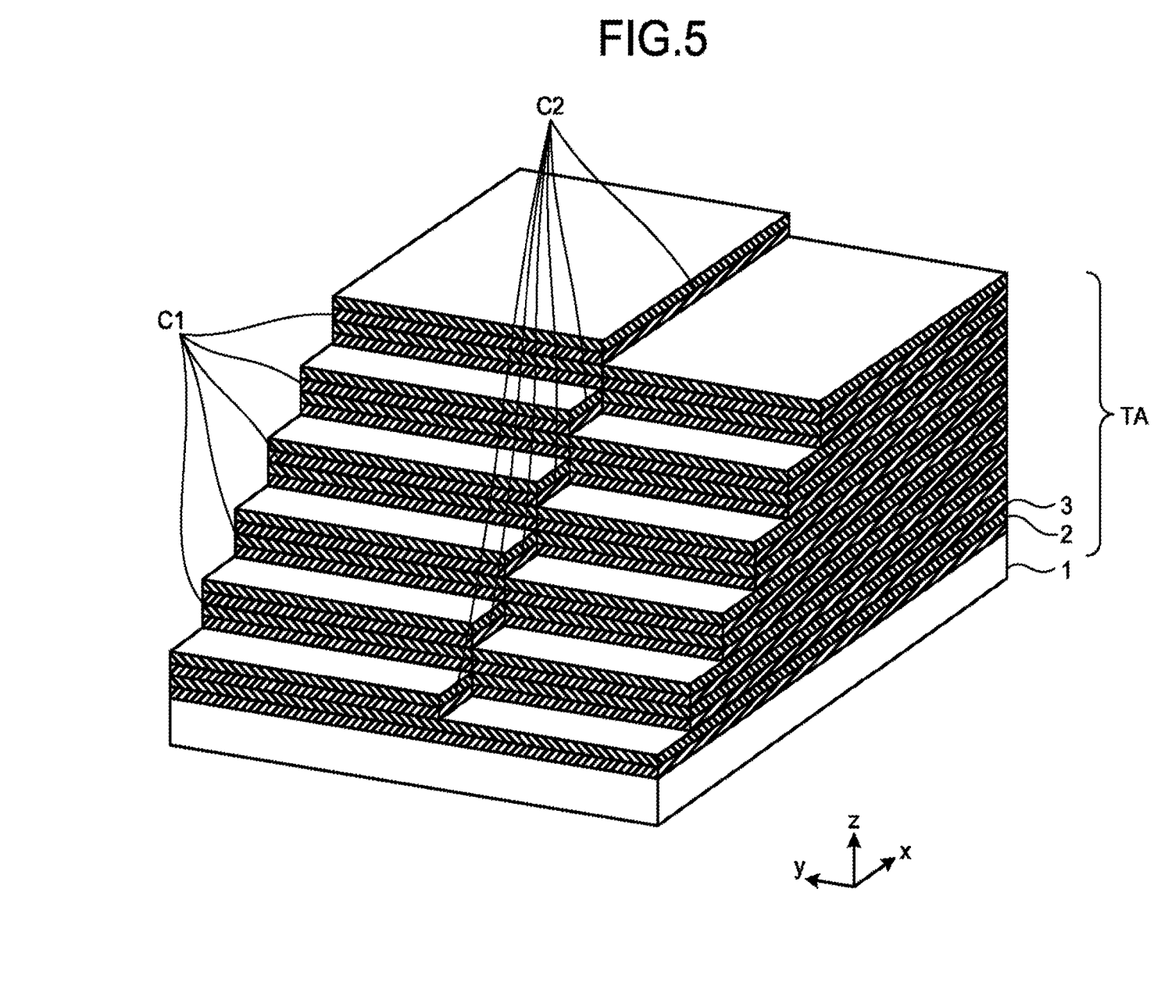
FIG. 5 is a perspective view of a three-dimensional step structure in a stacked body TA illustrated in FIG. 2C.

Next, as illustrated in FIG. 5, the stacked body TA is etched via a mask pattern formed on the etching pattern PE by photolithography to form steps C2 in the respective steps C1. The steps C1 are provided in the x direction and the steps C2 are provided in the y direction. The height of the steps C2 can be set to ½ the height of the steps C1. When one step C2 is to be formed in each of the steps C1, the process can be done only in one operation of photolithography.

Then, as illustrated in FIG. 2C, an insulation film 6 is formed to cover the steps C1 in the etching pattern PE by a method such as chemical vapor deposition (CVD). The material for the insulation film 6 can be a silicon oxide film, for example. After the formation of the insulation film 6, the surface of the insulation film 6 is flattened by a method such as chemical mechanical polishing (CMP).

Figure 2D:
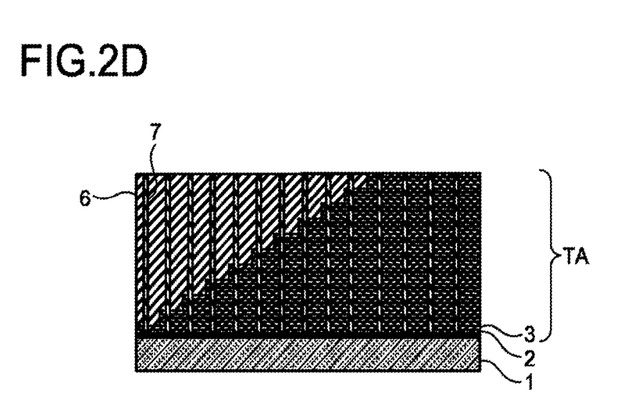

Next, as illustrated in FIG. 2D, columns 7 are embedded in the stacked body TA and the insulation film 6. The material for the columns 7 can be an insulator such as a silicon oxide film.

Figure 3A:
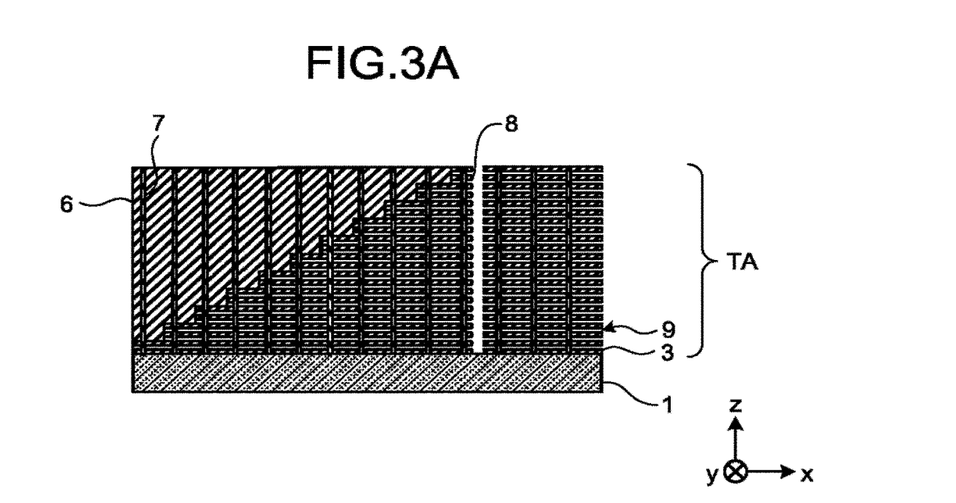
FIGS. 3A to 3C are cross-sectional views illustrating the manufacturing method of the semiconductor device according to the first embodiment.

Next, as illustrated in FIG. 3A, a slit 8 is formed to penetrate the stacked body TA in the z direction. The slit 8 can be disposed in the region without the steps C1. However, the slit 8 may be disposed in the dummy region with the steps.

Then, the insulation layers 2 are selectively removed by wet etching to form air gaps 9 between the insulation layers 3. At that time, an etching agent can enter into the stacked body TA via the slit 8. The insulation layers 3 separated from each other by the air gaps 9 can be supported on the base material 1 by the columns 7.

Figure 3B:
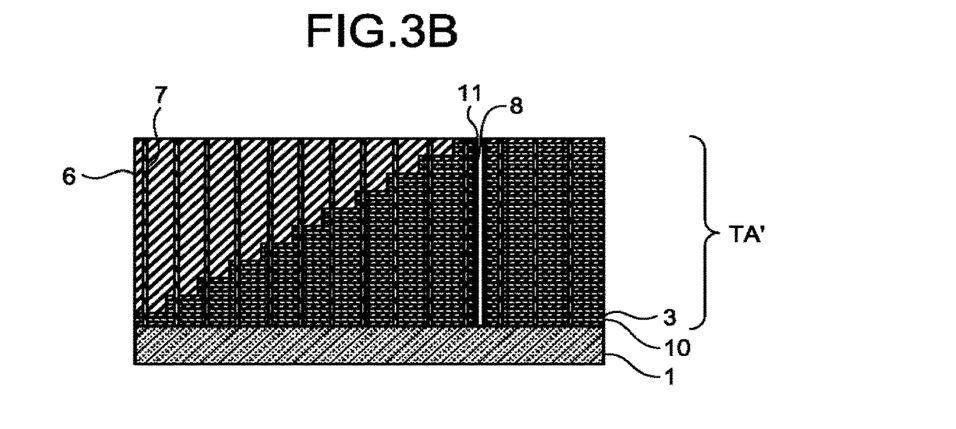

Next, as illustrated in FIG. 3B, conductive layers 10 are formed in the air gaps 9 by a method such as CVD. At that time, the base material 1 has a stacked body TA' in which the insulation layers 3 and the conductive layers 10 are alternately stacked. The material for the conductive layers 10 can be a metal such as W, for example. The conductive layers 10 can be used as word lines or select gate lines in a three-dimensional NAND flash memory.

Then, an insulation film 11 is formed on the side walls of the slit 8 by a method such as CVD. The material for the insulation film 11 can be a silicon oxide film, for example.

Figure 3C:
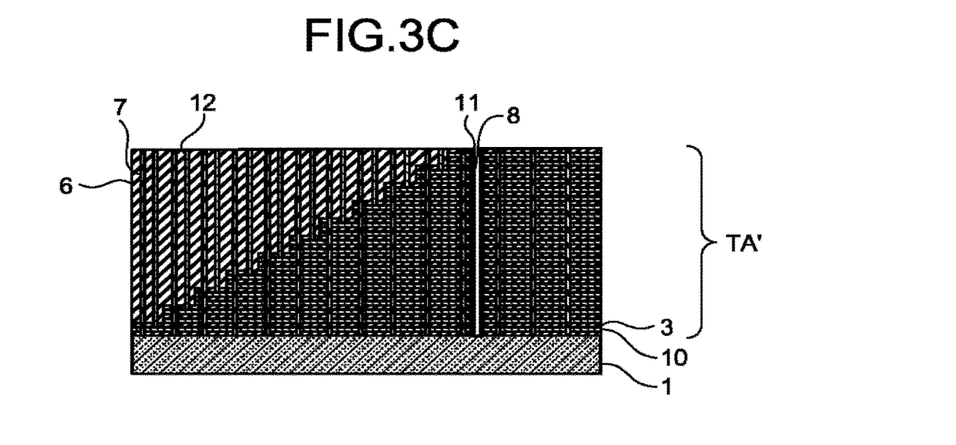

Next, as illustrated in FIG. 3C, conductors 12 are embedded in the insulation film 6. The material for the conductors 12 can be a metal such as W, for example. The conductors can be used as electrodes for contacting the conductive layers 10.

By imprint lithography, a staircase shape of three-dimensional structure can be formed in one operation of transfer of the template TP. This eliminates the need to reform the resist pattern many times to form the staircase shape of three-dimensional structure, thereby achieving improvement in throughput while cutting down on costs. The staircase shape of three-dimensional structure can be used for a three-dimensional wiring structure. The three-dimensional wiring structure can be used for an NAND flash memory of three-dimensional structure, a resistive random access memory (ReRAM) of three-dimensional structure, or the like.

In the foregoing embodiment, the method using imprint photolithography is used to form steps in the stacked structure in which the insulation layers 2 and 3 are alternately stacked. Alternatively, imprint photolithography may be used to form steps in a stacked structure in which insulation layers and conductive layers are alternately stacked. Still alternatively, imprint lithography may be used to form steps in a stacked structure in which insulation layers and semiconductor layers are alternately stacked.

Figure 6A:
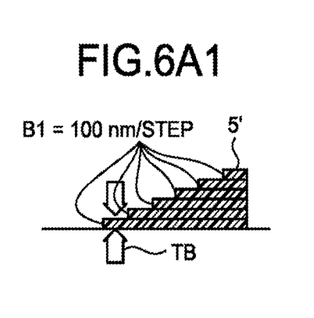

FIGS. 6A1 to 6A3 are cross-sectional views of the etching state of the imprint pattern 5', and FIGS. 6B1 to 6B3 are cross-sectional views of the etching state of the imprint pattern 5. In this case, the height of the steps B1 is 100 nm per step, and the height of the steps B2 is 200 nm per step.

Referring to FIG. 6A1, the imprint pattern 5' has six steps B1. In this case, for the formation of one step C1, the total etching amount of the imprint pattern 5' can be determined by a film thickness TB of the bottom stair.

Figure 6A:
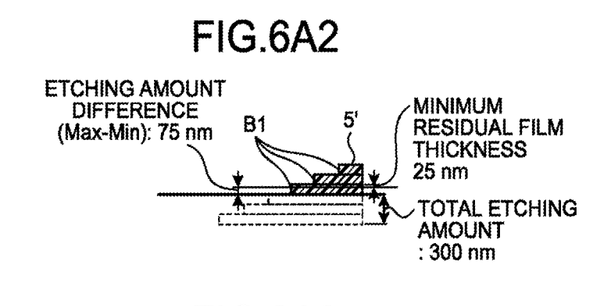

Next, as illustrated in FIG. 6A2, three steps B1 in the imprint pattern 5' are etched. In this case, the total etching amount of the imprint pattern 5' is 300 nm. It is assumed that the range of etching variations in the imprint pattern 5' is 25%. The difference in etching amount is 75 nm, and the minimum residual film thickness of the imprint pattern 5' is 2.5 nm. The difference in etching amount is the difference between a maximum value Max and a minimum value Min of the total etching amount.

Figure 6A:
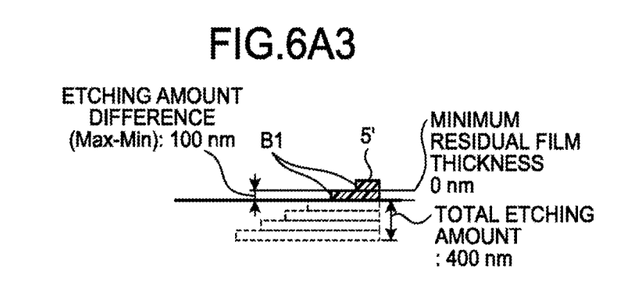

Next, as illustrated in FIG. 6A3, another step B1 in the imprint pattern 5' is etched. In this case, the total etching amount of the imprint pattern 5' is 400 nm. It is assumed that the range of etching variations in the imprint pattern 5' is 25%. The difference in etching amount is 100 nm, and the minimum residual film thickness of the imprint pattern 5' is 0 nm. Accordingly, when the imprint pattern 5' is etched by four steps, there occurs a step shift in the imprint pattern 5'.

Figure 6B:
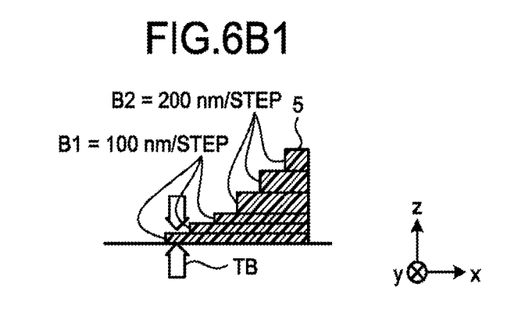

Meanwhile, referring to FIG. 6B1, the imprint pattern 5 has three steps B1 and three steps B2. In this case, for formation of one step C1, the total etching amount of the imprint pattern 5 can be determined by the film thickness TB of the bottom stair.

Figure 6B:
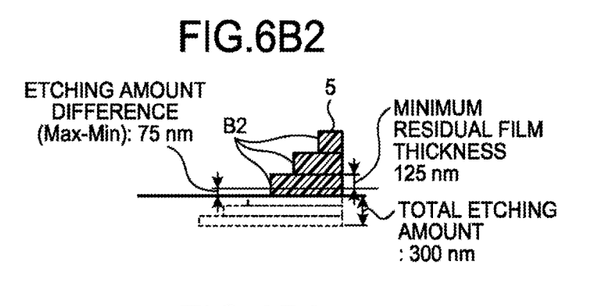

Next, as illustrated in FIG. 6B2, three steps B1 in the imprint pattern 5 are etched. In this case, the total etching amount of the imprint pattern 5 is 300 nm. It is assumed that the range of etching variations in the imprint pattern 5 is 25%. The difference in etching amount is 75 nm, and the minimum residual film thickness of the imprint pattern 5 is 125 nm.

Figure 6B:
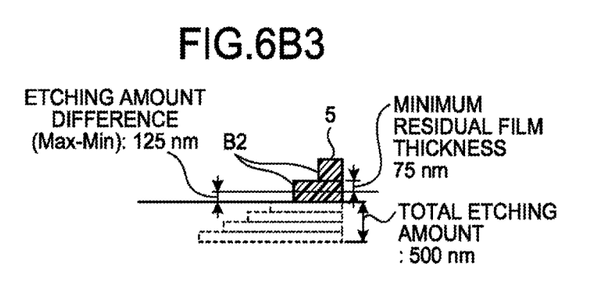

Next, as illustrated in FIG. 6B3, one step B2 in the imprint pattern 5 is etched. In this case, the total etching amount of the imprint pattern 5 is 500 nm. It is assumed that the range of etching variations in the imprint pattern 5 is 25%. The etching amount difference is 125 nm, and the minimum residual film thickness of the imprint pattern 5 is 75 nm. Accordingly, even when four steps in the imprint pattern 5 are etched, there occurs no step shift in the imprint pattern 5.

In general, a step shift does not occur in up to the Kth stair in the imprint pattern 5 but occurs in the (K+1)th and subsequent stairs. In this case, the height of the steps in the (K+1)th and subsequent stairs can be A times (A is a real number greater than 1) greater than the height of the steps in the Kth and preceding stairs in the template TP. Accordingly, it is possible to retard the occurrence of a step shift in the steps in the etching pattern etched with the imprint pattern 5 as a mask, up to the ((K+K(A−1)/A)th stairs.

For example, it is assumed that no step shift occurs at the time of etching on the first to the 10th stairs, and a step shift occurs at the time of etching on the 11th stair. In this case, doubling the height of the steps in the 11th and subsequent stairs makes it possible to retard a step shift up to the 15th stair. Accordingly, five more stairs can be etched in one operation of imprint lithography to achieve improvement in throughput while cutting down on costs. Further doubling the height of the steps in the 16th and subsequent stairs makes it possible to retard a step shift up to the 20th stair. Accordingly, ten more stairs can be etched in one operation of imprint lithography to achieve improvement in throughput while further cutting down on costs.

Second Embodiment

Figure 7A:
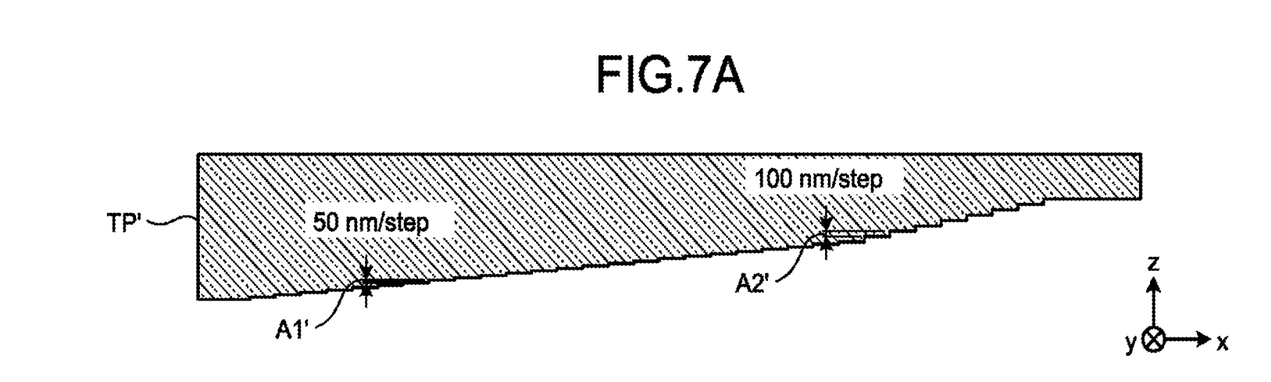
FIG. 7A is a cross-sectional view of a configuration of a template according to a second embodiment.

FIG. 7A is a cross-sectional view of a configuration of a template according to a second embodiment.

Referring to FIG. 7A, a template TP' has 32 steps. The first to 24th stairs have steps A1', and the 25th to 32nd stairs have steps A2'. The height of the steps A1' can be 50 nm, and the height of the steps A2' can be 100 nm.

Accordingly, it is possible to increase the margin of evenness of etching as compared to the case where the first to 32nd stairs have the steps A1'. For example, when the margin of evenness of etching with the steps A1' in the first to 32nd stairs is ±1.6%, the margin of evenness of etching with the use of the template TP' can be increased to ±2.1%.

Third Embodiment

Figure 7B:
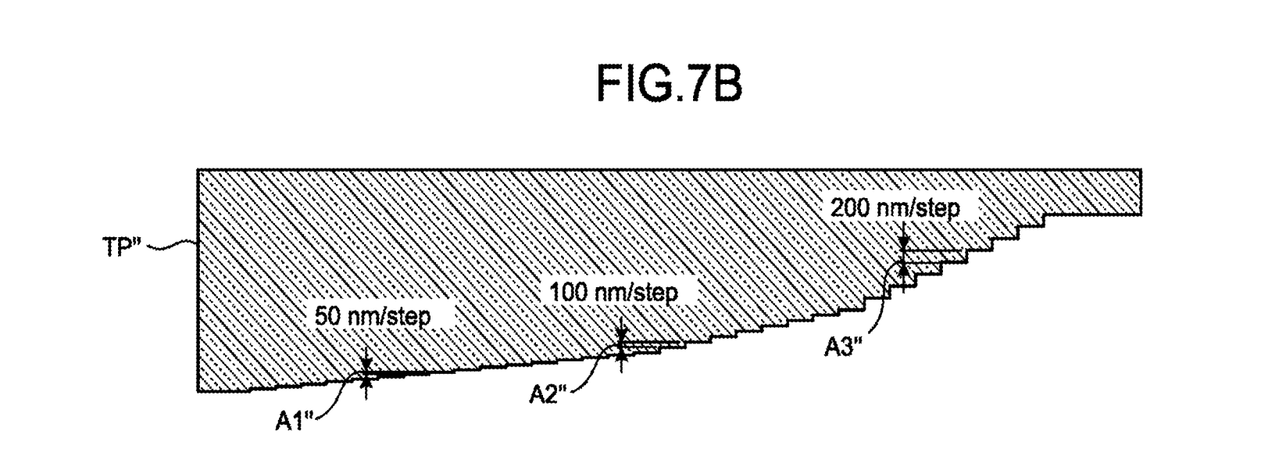
FIG. 7E is a cross-sectional view of a configuration of a template according to a third embodiment.

FIG. 7B is a cross-sectional view of a configuration of a template according to a third embodiment.

Referring to FIG. 7B, a template TP'' has 32 steps. The first to 16th stairs have steps A1'', the 17th to 24th stairs have steps A2'', and the 25th to 32nd stairs have steps A3''. The height of the steps A1'' can be 50 nm, the height of the steps A2'' can be 100 nm, and the height of the steps A3'' can be 200 nm.

Accordingly, it is possible to increase the margin of evenness of etching as compared to the case where the first to 32nd stairs have the steps A1'. For example, when the margin of evenness of etching with the steps A1' in the first to 32nd stairs is ±1.6%, the margin of evenness of etching with the use of the template TP'' can be increased to ±3.1%.

Fourth Embodiment

Figure 8A:
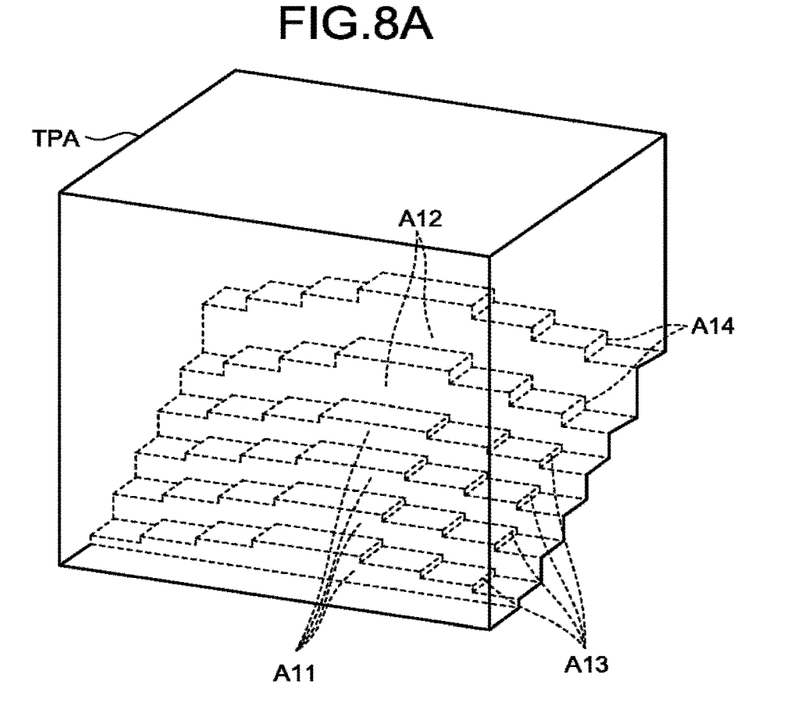
FIG. 8A is a perspective view of a configuration of a template according to a fourth embodiment.
Figure 8B:
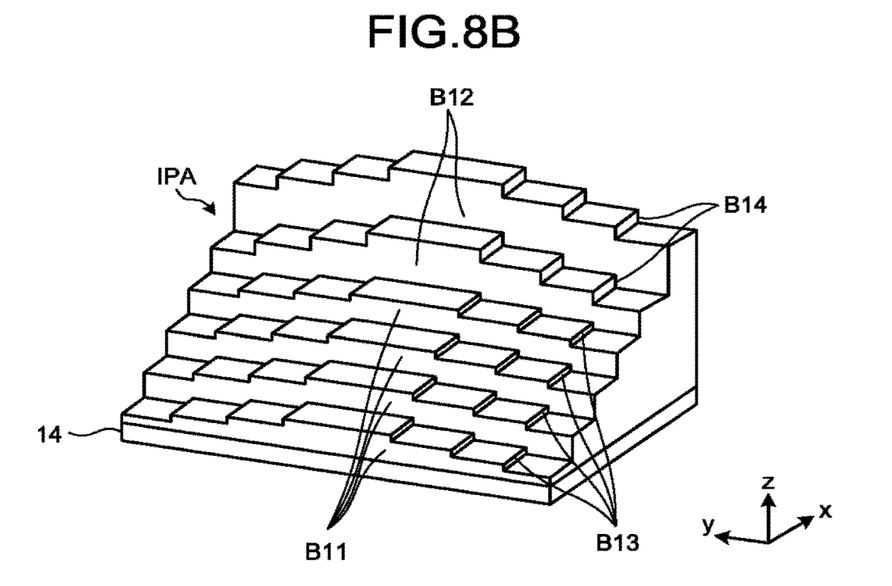
FIG. 8B is a perspective view of a configuration of an imprint pattern formed with the template illustrated in FIG. 8A.

FIG. 8A is a perspective view of a configuration of a template according to a fourth embodiment, and FIG. 8B is a perspective view of a configuration of an imprint pattern formed with the template illustrated in FIG. 8A.

Referring to FIG. 8A, a template TPA has steps A11 in a staircase pattern in the first to fourth stairs in the height direction, and has steps A12 in a staircase pattern in the fifth and sixth stairs in the same direction as the direction of the steps A11. The height of the steps A12 is greater than the height of the steps A11.

The template TPA has steps A13 in a staircase pattern in the steps A11 in the first to fourth stairs in a direction different from the direction of the steps A11, and steps A14 in a staircase pattern in the steps A12 in the fifth and sixth stairs in a direction different from the direction of the steps A12. The direction of the steps A11 can be orthogonal to the direction of the steps A13. The direction of the steps A12 can be orthogonal to the direction of the steps A14. In the y-axis direction, the steps A11 and A14 can constitute downward steps from the center to the both ends of the template TPA. The height of the steps A11 is less than the height of the steps A11. The height of the steps A14 is less than the height of the steps A12 and greater than the height of the steps A11.

The direction of the steps refers to the direction of the step surfaces of the individual steps. The step surfaces of the individual steps refer to vertical surfaces of the steps. For example, the step surfaces of the steps A11 and A12 are vertical surfaces perpendicular to the x axis. The step surfaces of the steps A13 and A14 are vertical surfaces perpendicular to the y axis.

Then, as illustrated in FIG. 8B, the template TPA is pressed against the imprint material to form an imprint pattern IPA on a base material 14. In the imprint pattern IPA, steps B11 are provided corresponding to the steps A11 in the template TPA, steps B12 are provided corresponding to the steps A12 in the template TPA, steps B13 are provided corresponding to the steps A13 in the template TPA, and steps B14 are provided corresponding to the steps A14 in the template TPA.

In the foregoing embodiment, the steps A13 and A14 different in height can be provided in the template TPA in a direction different from the direction of the steps A11 and A12 different in height. This makes it possible to form the imprint pattern IPA with steps of multi-step structure different in height in a plurality of directions in one operation of imprint lithography. Accordingly, it is possible to achieve improvement in throughput while preventing occurrence of a step shift in steps in an etching pattern formed with the imprint pattern IPA as a mask.

Fifth Embodiment

Figure 9:
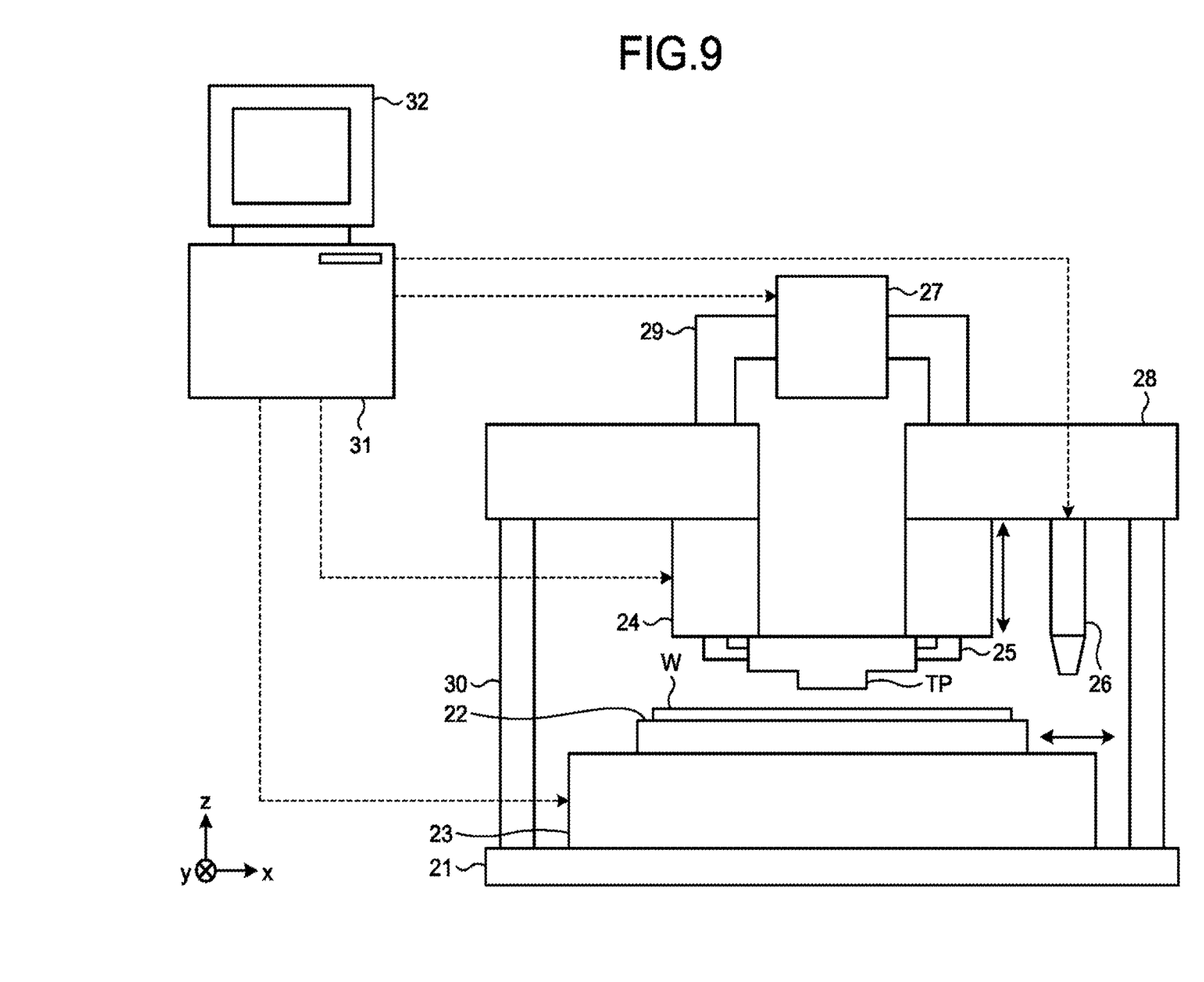
FIG. 9 is a side view of a schematic configuration of an imprint device according to a fifth embodiment.

FIG. 9 is a side view of a schematic configuration of an imprint device according to a fifth embodiment. FIG. 9 illustrates an ultraviolet-irradiation imprint device as an example.

Referring to FIG. 9, the imprint device includes a base 21 that supports the entire device, a stage 22 on which a wafer W is placed, a horizontal drive unit 23 that drives horizontally the stage 22, a vertical drive unit 24 that drives vertically the template TP, a support unit 25 that supports the template TP under the vertical drive unit 24, a drop unit 26 that drops an imprint material onto the wafer W, an irradiation unit 27 that irradiates the wafer W with ultraviolet rays, a support unit 28 that supports the vertical drive unit 24 and the drop unit 26 above the wafer W, a support unit 29 that supports the irradiation unit 27 above the template TP, and a support unit 30 that supports the support unit 28 above the wafer W. The imprint device also includes a control unit 31 that controls a nanoimprint operation and a display unit 32 that displays an operation screen for the imprint device, an operation status, and the like.

When the wafer W is conveyed onto the stage 22, the stage 22 is horizontally driven and the shot region in the wafer W is moved under the drop unit 26. Then, the drop unit 26 drops the imprint material onto the wafer W by an inkjet method or the like. When one shot of the imprint material is dropped, the template TP is lowered and pressed against the imprint material. In that state, the irradiation unit 27 irradiates the imprint material with ultraviolet rays via the template TP to cure the imprint material and form an imprint pattern made by transferring the template pattern in the template TP to the imprint material.

The template TP may be configured as illustrated in FIG. 1B, may be configured as illustrated in FIG. 7A, may be configured as illustrated in FIG. 7B, or may be configured as illustrated in FIG. 8A. Accordingly, at the time of formation of an etching pattern with an imprint pattern having steps of multi-step structure as a mask, it is possible to prevent occurrence of a step shift in the steps in the etching pattern even with the unevenness of the etching.

While certain embodiments have been described, the embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising a first surface and a second surface opposing each other, the first surface including first steps in first to Nth (N is an integer of 2 or greater) stairs formed in a staircase pattern from the first surface toward the second surface, wherein
the first steps are grouped into M groups wherein M is an integer of two or greater, and the first steps of each of the groups are same in height, the groups in first to Mth from the first surface toward the second surface being arranged at the first surface,
the groups of the first steps are formed such that the closer the groups to the second surface area, the higher the height of the first steps,
the first steps of the groups each include a second step that is formed in a direction different from the direction of the first steps, and
the second steps of each of the groups are lower in height than the first steps of the same group, and
the second steps of the groups are formed such that the closer to the second surface the groups, the higher the height of the second steps.

2. The template according to claim 1, wherein the direction of the first steps and the direction of the second steps are orthogonal to each other.

3. The template according to claim 1, wherein a ratio of the height of the first steps of an $(i+1)^{th}$ group to the height of the first steps of an $i^{th}$ group is greater than 1 and equal to or less than 5, wherein I is an integer of one or more to M−1 or less.

4. The template according to claim 1, wherein a material for the template is quartz.

5. An imprint device comprising:
a stage that holds a wafer;
a drop unit that drops an imprint material onto the wafer; and
a press unit that presses a template against the imprint material dropped onto the wafer, wherein
the template includes a first surface and a second surface opposing each other, the first surface including first steps in first to Nth (N is an integer of 2 or greater) stairs formed in a staircase pattern from the first surface toward the second surface,
the first steps are grouped into M groups wherein M is an integer of two or greater, and the first steps of each of the groups are same in height, the groups in first to Mth from the first surface toward the second surface being arranged at the first surface,
the groups of the first steps are formed such that the closer the groups to the second surface, the higher the height of the first steps,
the first steps of the groups each include a second step that is foil led in a direction different from the direction of the first steps,
the second steps of each of the groups are lower in height than the first steps of the same group, and
the second steps of the groups are formed such that the closer to the second surface the groups, the higher the height of the second steps.

6. The device according to claim 5, wherein the direction of the first steps and the direction of the second steps are orthogonal to each other.

7. The device according to claim 5, wherein a ratio of the height of the first steps of an $(i+1)^{th}$ group to the height of the first steps of an $i^{th}$ group is greater than 1 and equal to or less than 5, wherein I is an integer of one or more M−1 or less.

8. The device according to claim 5, further comprising an irradiation unit that irradiates the wafer with ultraviolet rays through the template, wherein
a material for the template is quartz.

* * * * *